United States Patent [19]

Kataoka et al.

[11] Patent Number: 4,565,767

[45] Date of Patent: Jan. 21, 1986

[54] LIGHT-SENSITIVE POLYMER COMPOSITION WITH POLY(AMIC ACID), BISAZIDE, AND TERTIARY AMINE COMPOUND

[75] Inventors: Fumio Kataoka; Fusaji Shoji, both of Yokohama; Isao Obara, Kamakura; Issei Takemoto, Yokohama; Hitoshi Yokono, Katsuta; Tokio Isogai, Fujisawa; Mitsumasa Kojima, Hitachi, all of Japan

[73] Assignees: Hitachi, Ltd; Hitachi Chemical Company, Ltd., both of Tokyo, Japan

[21] Appl. No.: 603,451

[22] Filed: Apr. 24, 1984

Related U.S. Application Data

[63] Continuation-in-part of Ser. No. 368,006, Apr. 13, 1982, abandoned.

[30] Foreign Application Priority Data

Apr. 13, 1981 [JP]  Japan .................................. 56-54408

[51] Int. Cl.$^4$ .............................. G03C 1/71; G03F 7/26
[52] U.S. Cl. .................................... 430/196; 430/197; 430/270; 430/283; 430/325; 430/330; 430/919; 430/927; 260/349
[58] Field of Search ............... 430/196, 197, 330, 927, 430/270, 283, 325, 919; 260/349

[56] References Cited

U.S. PATENT DOCUMENTS

| | | | |
|---|---|---|---|
| 2,940,853 | 6/1960 | Sagura et al. | 430/197 |
| 3,475,176 | 10/1969 | Rauner | 430/919 |
| 3,539,559 | 11/1970 | Ruckert | 260/349 |
| 3,714,194 | 1/1973 | Ulrich | 430/919 |
| 4,092,442 | 5/1978 | Agnihotri et al. | 430/330 |
| 4,093,461 | 6/1978 | Loprest et al. | 430/330 |
| 4,139,390 | 2/1979 | Rauner et al. | 430/919 |
| 4,243,743 | 1/1981 | Hiramoto et al. | 430/282 |
| 4,310,641 | 1/1982 | Ohmura et al. | 430/283 |
| 4,311,785 | 1/1982 | Ahne et al. | 430/283 |
| 4,321,319 | 3/1982 | Shoji et al. | 430/283 |
| 4,356,247 | 10/1982 | Aotani et al. | 430/197 |
| 4,451,551 | 12/1981 | Kataoka et al. | 430/197 |

OTHER PUBLICATIONS

Chemical Abstracts, vol. 95, #159904f, 1981, (Hitachi—Japanese Kokai-81-024,344, 3/1981).

*Primary Examiner*—Charles L. Bowers, Jr.
*Attorney, Agent, or Firm*—Antonelli, Terry & Wands

[57] ABSTRACT

A light-sensitive polymer composition comprising a poly(amic acid), a special bisazide compound and an amine compound can give a film which has high sensitivity and in which portions exposed to light are not easily released by a developing solution at the time of development.

11 Claims, No Drawings

LIGHT-SENSITIVE POLYMER COMPOSITION WITH POLY(AMIC ACID), BISAZIDE, AND TERTIARY AMINE COMPOUND

CROSS-REFERENCE TO RELATED APPLICATIONS

This application is a continuation-in-part of application Ser. No. 368,006 filed Apr. 13, 1982 abandoned.

BACKGROUND OF THE INVENTION

1. Field of the Invention

This invention related to a light-sensitive polymer composition which can yield a heat resistant polymer, particularly to a light-sensitive polymer composition which is used for forming a heat resistant relief pattern.

2. Description of the Prior Art

Light-sensitive polymer compositions are used in passivation films, insulating films or protecting films for semiconductor elements and the like, and photoresists.

The above-mentioned light-sensitive polymer compositions include (i) a composition comprising a poly(amic acid), an organic compound having in the molecule a photosensitive olefinic double bond and an amino group or a quaternary ammonium salt, and Michler's ketone as photosensitizer (U.S. Pat. No. 4,243,743), (ii) a composition comprising a poly(amic acid) having a photosensitive olefinic double bond in the molecule and Michler's ketone, nitrofluolene, 5-nitroacenaphthalene as photosensitizer (U.S. Pat. No. 4,321,319), (iii) a composition comprising a modified poly(amic acid) obtained by reacting a —COOH of a poly(amic acid) with an amino group of an amine compound having a vinyl group in the molecule (Japanese Patent Appln Kokai (Laid-Open) No. 24,344/81), and (iv) a composition comprising a modified poly(amic acid) obtained by introducing a methacryl group or an acryl group as a photosensitive group into the ester residue of a poly(amic acid) and Michler's ketone as a photosensitizer or a composition comprising the aforesaid modified poly(amic acid), N-phenylmaleimide and Michler's ketone (U.S. Pat. No. 4,366,230).

However, all of the light-sensitive polymer compositions of above (i) to (iii) have sensitivity as low as the order of several thousands mJ/cm$^2$, have not given a fine pattern because portions exposed to light are released when development is carried out after exposure to light, and are obtained under narrow process conditions.

The light-sensitive polymer composition of above (iv) has not given a fine pattern because portions exposed to light is released when development is carried out after exposure to light, and it is obtained under narrow process conditions.

SUMMARY OF THE INVENTION

An object of this invention is to provide a light-sensitive polymer composition which has high sensitivity and in which portions exposed to light are not easily released by a developing solution at the time of development.

The object described above can be achieved by using, as photosensitizer at least one special bisazide compound.

This invention provides a light-sensitive polymer composition comprising (a) 100 parts by weight of a poly(amic acid), (b) 0.1 to 100 parts by weight of at least one bisazide compound selected from the group consisting of

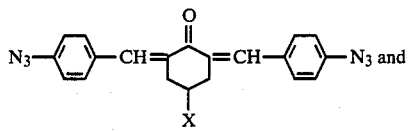

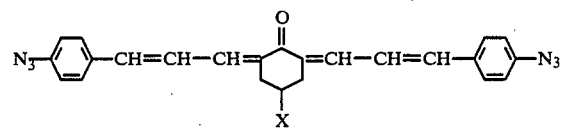

wherein X is —OH, —R$^{3'}$OH, —OR$^3$ or —COOH; R$^3$ is a lower alkyl group; R$^{3'}$ is an alkenylene group; and (c) 1 to 400 parts by weight of a tertiary amine compound.

DESCRIPTION OF THE PREFERRED EMBODIMENTS

The light-sensitive polymer composition of this invention has high sensitivity (at least 19 mJ/cm$^2$), is not easily released by a developing solution when portions exposed to light are developed, and hence can give a fine pattern.

The materials used in this invention and the like are explained below. As the poly(amic acid), those having in the molecule the following repeating units (A) to (F) are preferred. These poly(amic acid)s are used alone or as a mixture thereof.

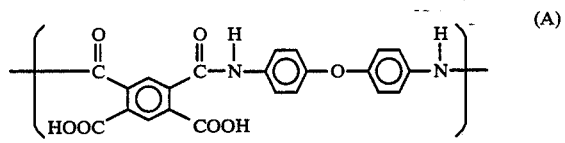

(A)

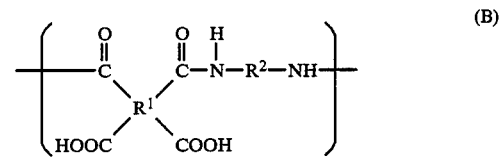

(B)

wherein R$^1$ is

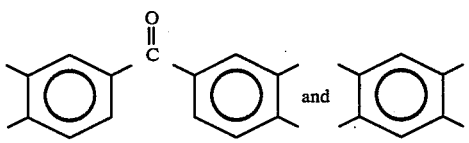

(1:1, molar ratio), and R$^2$ is

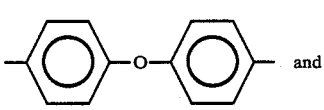

and

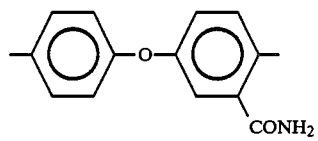

(9:1, molar ratio),

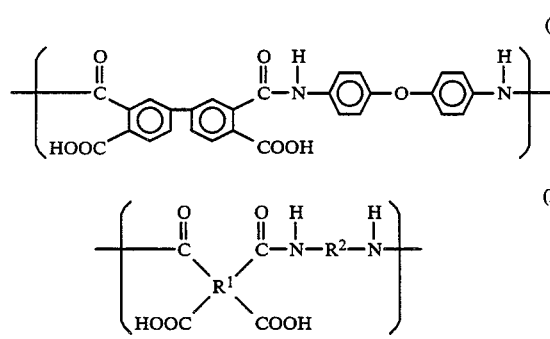

wherein R¹ is

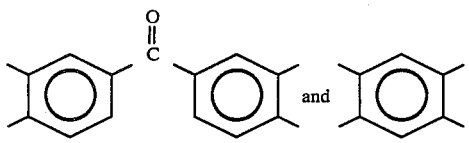

(1:1, molar ratio), and R² is

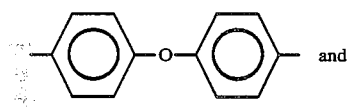

and

—(CH₂)₃—Si(CH₃)₂—O—Si(CH₃)₂—(CH₂)₃—

(9:1, molar ratio),

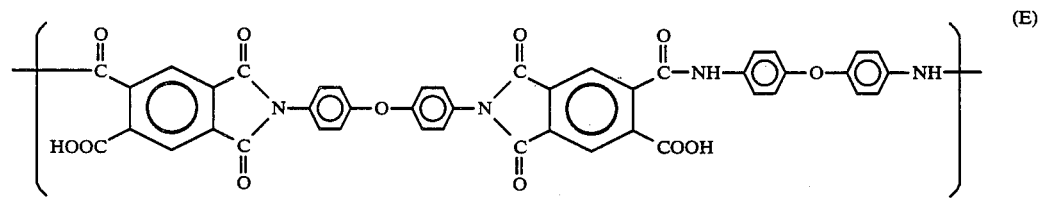

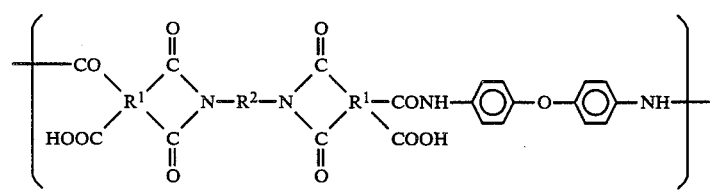

wherein R¹ is

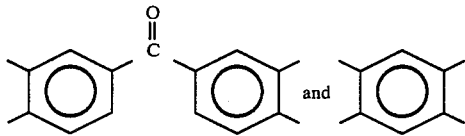

(1:1, molar ratio); and R² is and

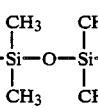

(9:1, molar ratio).

As the bisazide compound, there is used at least one bisazide compound selected from the group consisting of N₃—C₆H₄—CH=[C(=O)cyclohexanone(X)]=CH—C₆H₄—N₃ and N₃—C₆H₄—CH=CH—CH=[C(=O)cyclohexanone(X)]=CH—CH=CH—C₆H₄—N₃ wherein X is —OH, —R³'OH, —OR³ or —COOH; R³ is a lower alkyl group preferably having 1 to 3 carbon atoms, and R³' is an alkenylene group preferably having 1 to 3 carbon atoms.

Among them, 2,6-di(4'-azidobenzal)-4-hydroxymethylcyclohexanone, 2,6-di(4'-azidobenzal)-4-carboxycyclohexanone, 2,6-di(4'-azidobenzal)-4-methoxycyclohexanone, 2,6-di(4'-azidobenzal)-4-hydroxycyclohexanone and 2,6-di(4'-azidocinnamylidene)-4-carboxycyclohexanone are preferred. Further, 2,6-di(4'-azidobenzal)-4'-carboxycyclohexanone and 2,6-di(4'- azidocinnamylidene)-4-carboxycyclohexanone are more preferred since their synthesis routes are not long and complicated unlike that of 2,6-di(4'-azidobenzal)-4-hydroxymethylcyclohexanone and 2,6-di(4'-azidobenzal)-4-hydroxycyclohexanone and they are more easily soluble in aprotic polar solutions than 2,6-di(4'-azidobenzal)-4-methoxycyclohexanone. All of these bisazide compounds may be used alone or as a mixture thereof.

The bisazide compound is used in an amount of 0.1 to 100 parts by weight based on 100 parts by weight of the poly(amic acid). When the amount of the bisazide compound is less than 0.1 part by weight, the amount of crosslinked chains is so small that the portions exposed to light are easily released into a developing solution, while when it is more than 100 parts by weight, the resulting polyimide film has lowered heat resistance.

As tertiary the amine compound, there is used at least one compound selected from the group consisting of

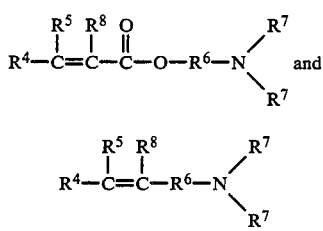

wherein $R^4$ is a vinyl group, a propenyl group, a lower alkyl group preferably having 1 to 3 carbon atoms or hydrogen; $R^5$ is a lower alkyl group preferably having 1 to 3 carbon atoms or hydrogen; $R^6$ is an alkylene group preferably having 1 to 6 carbon atoms; $R^7$ is a lower alkyl group preferably having 1 to 3 carbon atoms; and $R^8$ is a lower alkyl group preferably having 1 to 3 carbon atoms or hydrogen.

Examples of the tertiary amine compound are 2-(N,N—dimethylamino)ethyl methacrylate

[CH$_2$=$\overset{\overset{\displaystyle CH_3}{|}}{C}$COOCH$_2$CH$_2$N(CH$_3$)$_2$], 3-(N,N—dimethylamino)propyl methacrylate [CH$_2$=$\overset{\overset{\displaystyle CH_3}{|}}{C}$COOCH$_2$CH$_2$CH$_2$N(CH$_3$)$_2$], 4-(N,N—dimethylamino)butyl methacrylate

[CH$_2$=$\overset{\overset{\displaystyle CH_3}{|}}{C}$COO(CH$_2$)$_4$N(CH$_3$)$_2$], and 3-(N,N-dimethylamino)propyl-1,3-pentadienecarboxylate [CH$_3$—CH=CH—CH=CH-COOCH$_2$CH$_2$CH$_2$N(CH$_3$)$_2$]. These may be used alone or as a mixture thereof.

The tertiary amine compound is used in an amount of 1 to 400 parts by weight based on 100 parts by weight of the poly(amic acid). When the amount of the tertiary amine compound is less than 1 part by weight, the amount of crosslinked chains is small, so that the portions exposed to light are easily released into a developing solution, while when it is more than 100 parts by weight, the resulting polyimide film has lowered heat resistance.

The light-sensitive polymer composition of this invention comprising a poly(amic acid), at least one bisazide compound and an amine compound can be used in the form of a solution dissolved in an aprotic polar solvent. As the aprotic polar solvent, N-methyl-2-pyrrolidone and N,N-dimethylacetamide are preferred. These may be used alone or as a mixture thereof.

The amount of the aforesaid solvent to be incorporated is 100 to 10,000 parts by weight per 100 parts by weight of the total of the aforesaid poly(amic acid), the aforesaid bisazide compound and the aforesaid amine compound. When it is outside this range, the film-forming properties are deteriorated.

When the sensitivity of the light-sensitive polymer composition of this invention is desired to be further improved, a photosensitizer can be added thereto. The amount of the photosensitizer to be incorporated is 0.1 to 10 parts by weight per 100 parts by weight of the total of the aforesaid poly(amic acid), the aforesaid bisazide compound and the aforesaid amine compound. When it is less than 0.1 part by weight, the photosensitizer has no effect, and when it is more than 10 parts by weight, the resulting polyimide film has lowered heat resistance.

Examples of the photosensitizer include 1,9-benzanthrone, acridine, cyanoacridine, nitropyrene, 1,8-dinitropyrene, Michler's ketone and the like.

These photosensitizers can be used alone or as a mixture thereof.

In order to further improve the adhesion between a substrate and a coating film formed thereon, an adhesion-improving agent can be added to the light-sensitive polymer composition of this invention.

The substrate can be made of metals, glass, semiconductors, metal oxide insulators such as TiO$_2$, Ta$_2$O$_5$, SiO$_2$ and the like, cermets such as silicon nitride and the like, etc.

The light-sensitive polymer composition of this invention can be used in the form of a solution, which is then formed into a coating film on a substrate by a conventional coating method, e.g. a spin coating method using a spinner, a dip method or a spray method. The thickness of the coating film can be controlled by a coating means and the viscosity of the coating solution.

Relief patterns can be formed by placing a mask on the coating film thus formed on a substrate, exposing the coating film to light such as ultraviolet light, and dissolving and removing the portions not exposed to light with a developing solution. The exposure to light can be carried out not only by ultraviolet light but also by visible lights or other radiation.

As the developing solution, N-methyl-2-pyrolidone, N,N-dimethylformamide and N,N-dimethylacetamide are preferred which are aprotic polar. These can be used alone or as a mixture thereof.

The aprotic polar developing solutions described above may be used in the form of mixtures with alcohols such as methanol, ethanol, isopropyl alcohol or the like, toluene, xylene, methyl Cellosolve, etc.

The relief pattern formed in the manner described above is washed with a rinsing solution to remove the developing solution attached.

As the rinsing solution, there can be used a non-solvent for the poly(amic acid) which is miscible with the developing solution. Preferable examples of the rinsing solution are alcohols such as methanol, ethanol, isopropyl alcohol and the like, benzene, toluene, xylene, methyl Cellosolve, and the like. These can be used alone or as a mixture thereof.

The relief pattern washed with the rinsing solution is a precursor of polyimide though it has undergone polymerization and is converted into a polyimide excellent in heat resistance upon heating to 150° to 450° C.

This invention is explained more in detail below referring to Synthesis Examples and Examples.

SYNTHESIS EXAMPLE 1

[Synthesis of 2,6-di(4'-azidobenzal)-4-hydroxymethylcyclohexanone]

Synthetic route

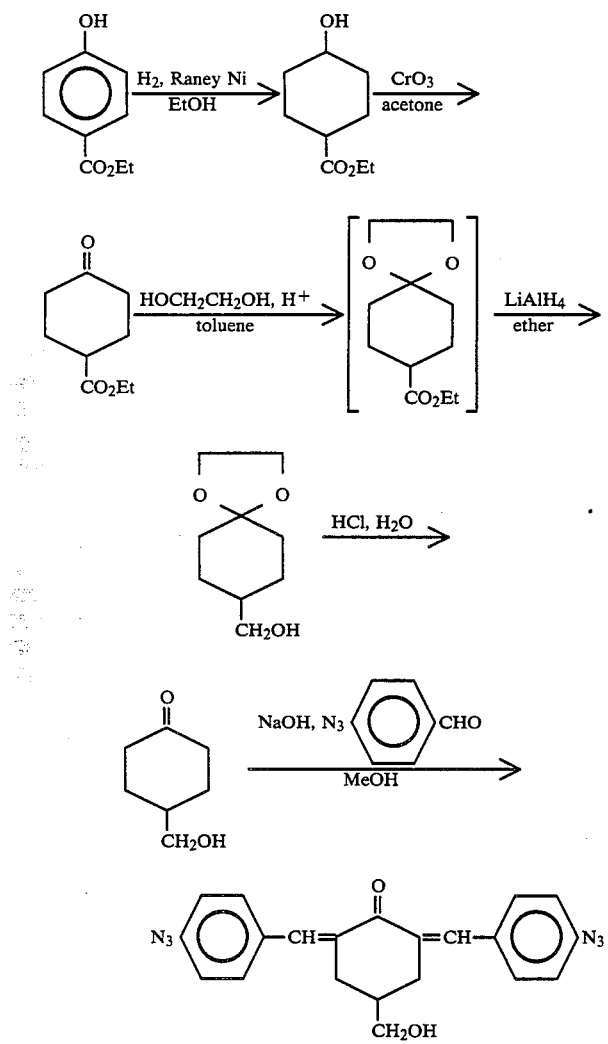

Me: methyl
Et: ethyl

In an autoclave made of stainless steel having a volume of 1 liter were placed 142 g (0.86 mole) of ethyl para-hydroxybenzoate, 10 g of Raney Ni catalyst (activity W-7) and 400 ml of ethanol, and reacted with stirring at a pressure of hydrogen of 100 kg/cm² and a reaction temperature of 150° C. for 20 hours. After the autoclave was allowed to cool to room temperature, the hydrogen in the vessel was released, and the Raney Ni catalyst was then removed by suction filtration. The filtrate was concentrated by means of a rotary evaporator and then distilled under reduced pressure to obtain 117 g (0.68 mole, yield 79%) of 4-ethoxycarbonylcyclohexanol having a boiling point of 98° to 104° C./4 mmHg.

In 1 liter of acetone was dissolved 110 g (0.64 mole) of the resulting 4-ethoxycarbonylcyclohexanol, and the resulting solution was cooled to 5° C. or lower on an ice bath. To this solution was added dropwise a solution containing 69 ml of sulfuric acid, 80 g (0.8 mole) of chromic anhydride and 220 ml of water while the reaction temperature was controlled so as to be 15° C. or lower. The addition was stopped at the time when three quarters of the aforesaid chromic acid solution had been added. Then, in order to remove the surplus oxidant, 5 ml of isopropyl alcohol was added, and the resulting mixture was subjected to reaction at room temperature for 30 minutes. The supernatant was separated by decantation, after which the remaining solid was washed with two 300-ml portions of acetone, and the washings were combined with the supernatant. Next, the resulting solution was neutralized by use of a saturated aqueous solution of sodium hydrogencarbonate. The acetone solution was concentrated by means of a rotary evaporator and then distilled under reduced pressure to obtain 89 g (0.52 mole, yield: 81%) of 4-ethoxycarbonylcyclohexane having a boiling point of 95° to 97° C./2 mmHg.

In a round bottom flask equipped with a Dean-Stark moisture meter were placed 30 g (0.177 mole) of 4-ethoxycarbonylcyclohexane, 32 g (0.5 mole) of ethylene glycol, 1.5 g of para-toluenesulfonic acid (acid catalyst) and 200 ml of toluene, and heated and refluxed. The heating was stopped at the time when the volume of the lower layer (water) of the moisture meter reached about 10 ml, and the flask was allowed to cool to room temperature. Next, the toluene solution in the flask was washed with two 100-ml portions of water to remove the catalyst. The residue was dried over anhydrous magnesium sulfate for 24 hours and then concentrated by means of a rotary evaporator (4-ethoxycarbonylcyclohexanoneethyleneacetal was produced). The concentrate was dissolved in 50 ml of anhydrous ether, and the resulting solution was added dropwise to a suspension of 6.7 g (0.177 mole) of lithium aluminum hydride in 300 ml of anhydrous ether at a speed so as to continue the reflux caused by the reaction heat mildly. After the addition, the resulting mixture was heated and refluxed for additional 3 hours. Thereafter, 6.7 ml of water was carefully dropped into the mixture with cooling on a water-ice-bath, followed by dropping thereinto 6.7 ml of a 15% aqueous sodium hydroxide solution. Then, 20 ml of water was finally dropped thereinto, and the resulting mixture was stirred at room temperature for 1 hour. The solid and the ether solution were separated from each other by suction filtration, and the ether solution was freed from the ether by distillation, concentrated, and then distilled under reduced pressure to obtain 22 g (0.128 mole, yield: 72%) of 4-hydroxymethylcyclohexanoneethyleneacetal, having a boiling point of 104° to 107° C./1 mmHg.

To 8.3 g (0.048 mole) of the 4-hydroxymethylcyclohexanoneethyleneacetal was added 26 ml of 3N hydrochloric acid, and the resulting mixture was stirred to be made homogeneous, and then subjected to reaction at room temperature for 2 hours. Thereafter, several drops of a phenolphthalain solution was added, and a 12N aqueous sodium hydroxide solution was added dropwise until the resulting mixture has a red color. Next, 3N hydrochloric acid was added until the red color disappeared, after which 0.5 g of sodium hydrogencarbonate was added. When the water was distilled off under reduced pressure (30 to 50 mmHg), the residue was in a condition of a suspension of crystals (NaCl and sodium hydrogencarbonate) in a liquid. To the liquid was added 50 ml of ethanol to further deposit the salts and the salts were removed by suction filtration. The filtrate was freed from the methanol by distillation, concentrated, and then distilled under reduced pressure by using a rectifying column equipped with a spinning band column to obtain 4.2 g (0.033 mole, yield: 69%) of 4-hydroxymethylcyclohexanone having a boiling point of 110° to 112° C./2 mmHg.

Next, 1 g of the 4-hydroxymethylcyclohexanone and 3 g of para-azidobenzaldehyde were dissolved in 10 ml of ethanol, after which one-fifth of a solution of 0.4 g of sodium hydroxide in 0.4 ml of water was added, and the resulting mixture was subjected to reaction in a brown flask at room temperature for 2 days. The crystals formed were separated by suction filtration, washed with ethanol, and then recrystallized from ethyl Cellosolve to obtain 0.5 g of yellow crystals having a decomposition point of 145° to 155° C. (differential thermal analysis, the rate of heating: 5° C./min). This product was identified as the compound described in the title by spectral analysis and elementary analysis. Infrared absorption spectrum data: 1600 cm$^{-1}$ ($>$C=O), 2130 cm$^{-1}$ (—N$_3$). Elementary analysis values: calculated for $C_{21}H_{18}O_2N_6$: C, 65.3: H, 4.7: N, 21.8, found: C, 65.5: H, 4.7: N, 22.0.

SYNTHESIS EXAMPLE 2

[Synthesis of 2,6-di(4'-azidobenzal)-4-carboxylcyclohexanone]

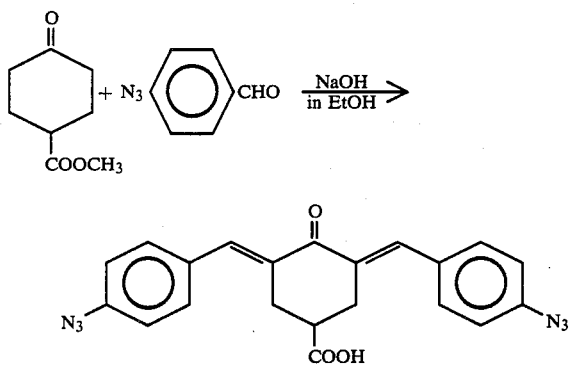

In 50 ml of ethanol were dissolved 5 g of 4-methoxycarbonylcyclohexane and 10 g of para-azidobenzaldehyde. Then, a solution of 2 g of sodium hydroxide in 4 ml of water was added thereto, and the resulting mixture was refluxed in a brown flask for 6 hours. The crystals formed were separated by suction filtration and then treated several times with dilute hydrochloric acid. The crystals thus treated were washed with water and then recrystallized from methanol to obtain 1.8 g of yellowish-orange crystals having a decomposition point of 150° to 155° C. (differential thermal analysis, the rate of heating: 5° C./min).

This product was identified as the compound described in the title by spectral analysis, elementary analysis, and colorimetry using Bromothymol Blue. Infrared absorption spectrum data: 1600 cm$^{-1}$ ($>$C=O), 2130 cm$^{-1}$ (—N$_3$). Elementary analysis values: calculated for $C_{21}H_{16}O_3N_6$: C, 63.0; H, 4.0; N, 21.0, found: C, 62.6; H, 3.9; N, 20.6.

SYNTHESIS EXAMPLE 3

[Synthesis of 2,6-di(4'-azidocinnamylidene)-4-carboxylcyclohexanone]

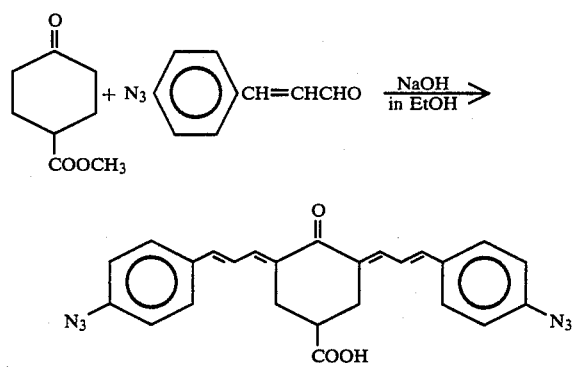

In 10 ml of ethanol were dissolved 1 g of 4-methoxycarbonylcyclohexane and 2 g of para-azidocinnamaldehyde, after which a solution of 0.4 g of NaOH in 4 ml of water was added, and the resulting solution was subjected to reaction in a brown flask at 50° C. for 6 hours. The crystals formed were separated by suction filtration and then treated several times with dilute hydrochloric acid. The crystals thus treated were washed with water and then recrystallized from methyl Cellosolve to obtain 0.3 g of orange crystals having a decomposition point of 165° to 170° C. (differential thermal analysis, the rate of heating: 5° C./min).

This product was identified as the compound described in the title by infrared absorption spectrum analysis, elementary analysis and colorimetry using Bromothymol Blue. Infrared absorption spectrum data: 1595 cm$^{-1}$ ($>$C=O), 2140 cm$^{-1}$ (—N$_3$). Elementary analysis values: calculated for $C_{25}H_{20}O_3N_6$: C, 66.4; H, 4.4; N, 18.6, found: C, 59.9; H, 4.5; N, 18.2.

SYNTHESIS EXAMPLE 4

[Synthesis of 2,6-di(4'-azidobenzal)-4-methoxycyclohexanone]

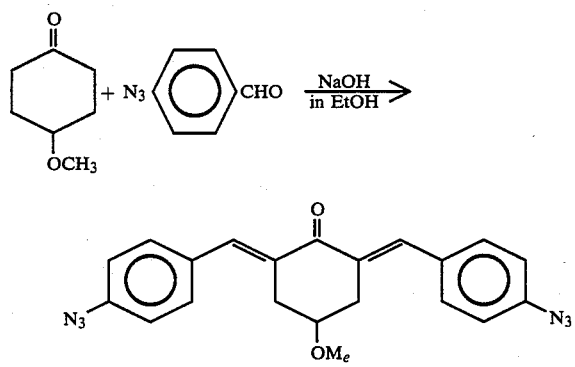

In 100 ml of ethanol were dissolved 10 g of 4-methoxycyclohexanone and 30 g of para-azidobenzaldehyde, after which a solution of 1 g of sodium hydroxide in 1 ml of water was added, and the resulting mixture was subjected to reaction in a brown flask at room temperature for 2 days. The crystals formed were separated by suction filtration, washed with ethanol, and then recrystallized from methyl Cellosolve to obtain 4.7 g of yellow crystals having a decomposition point of 145° to 150° C. (differential thermal analysis, the rate of heating: 5° C./min).

This product was identified as the compound described in the title by infrared absorption spectrum analysis and elementary analysis. Infrared absorption spectrum data: 1600 cm$^{-1}$ (>C=O), 2130 cm$^{-1}$ (—N$_3$). Elementary analysis values: calculated for C$_{21}$H$_{18}$O$_2$N$_6$: C, 65.3; H, 4.7; N, 21.8, found: C, 65.1; H, 4.7; N, 21.5.

SYNTHESIS EXAMPLE 5

[Synthesis of 2,6-di(4'-azidobenzal)-4-hydroxycyclohexanone]

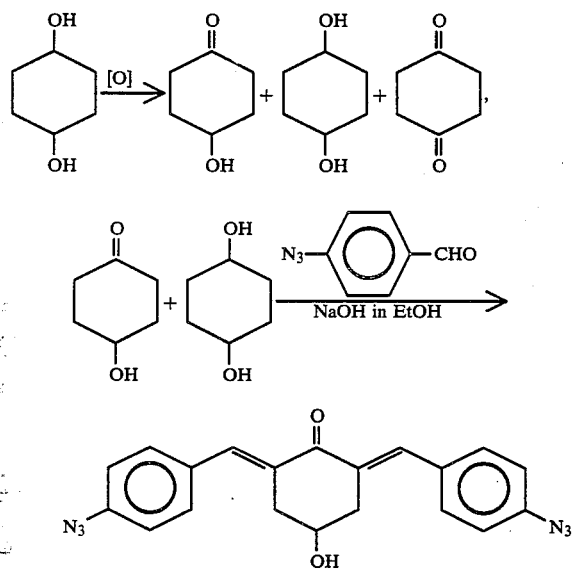

In 3 liters of acetone was dissolved 100 g (0.86 mole) of 1,4-cyclohexanediol, and to the resulting solution was added dropwise, with stirring, a solution consisting of 20 g (0.2 mole, the amount required to oxidize 17.6% of the hydroxyl group of the aforesaid diol into a ketone group) of chromic anhydride, 17 g of concentrated sulfuric acid and 55 g of water while the reaction temperature was controlled so as to be 0° to 10° C. by using a cold bath. After the addition, the resulting mixture was stirred for additional 10 minutes, after which the solution was separated by decantation, treated with sodium hydrogencarbonate, concentrated, and then distilled under reduced pressure to obtain 74 g of a product, b.p. 120° to 125° C./2 mmHg. On gas chromatographic analysis, this distillate was found to be a mixture of 1,4-cyclohexanediol and 4-hydroxycyclohexanone in the weight ratio of 7:3 (the yield on the basis of the oxidant of the 4-hydroxycyclohexanone was 73% by weight). From this result, the 4-hydroxycyclohexanone content was considered to be 25 g (0.22 mole), and this mixture and 73.5 g (0.5 mole) of para-azidobenzaldehyde were dissolved in 500 ml of methanol, after which a solution of 1 g of (0.025 mole) of sodium hydroxide in 1 ml of water was added thereto. After the resulting mixture was subjected to reaction at room temperature for 2 days, the crystals formed were separated by suction filtration and recrystallized from acetonitrile to obtain 36 g (yield: 44%) of 2,6-di(-paraazidobenzal)-4-hydroxycyclohexanone (thermal decomposition point: 148° C.).

This product was identified as the compound described in the title by infrared absorption spectrum analysis and elementary analysis. Infrared absorption spectrum data: 1600 cm$^{-1}$ (>C=O), 2150 cm$^{-1}$ (—N$_3$). Elementary analysis values: calculated for C$_{20}$H$_{20}$O$_2$N$_6$: C, 64.51; H, 4.32; N, 22.57, found: C, 64.45; H, 4.12; N, 22.55.

EXAMPLE 1

An amine solution was prepared by dissolving 100 g (0.5 mole) of 4,4'-diaminodiphenyl ether in 1791 g of N-methyl-2-pyrrolidone in a nitrogen stream. While maintaining the amine solution at about 15° C. with ice cooling, 109 g (0.5 mole) of pyromellitic acid dianhydride was added thereto with stirring. After completion of the addition, the reaction was continued at about 15° C. for additional 3 hours to give a solution (A) of poly(amic acid) having a repeating unit of the formula:

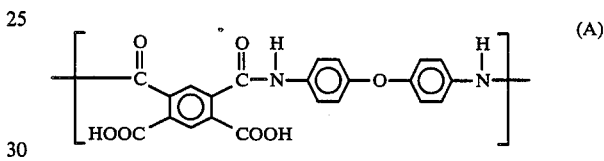

and having a viscosity of 60 poises (30° C.).

In 20 g of the solution (A), 1.71 g (0.01 mole) of 3-(N,N-dimethylamino)propyl methacrylate and 0.39 g (0.001 mole) of 2,6-di(4'-azidobenzal)-4-methoxycyclohexanone were dissolved. The resulting solution was filtered under pressure using a filter having pores of 1 μm.

The resulting solution was spin coated on a silicon wafer substrate using a spinner and dried at 70° C. for 30 minutes to give a coating film of 5.2 μm thick. The coating film was closely covered with a striped photomask made of soda glass and then irradiated with ultraviolet light from a 500 W high pressure mercury lamp. After exposure to light, the coating film was developed with a mixed solution of N-methyl-2-pyrrolidone and ethanol (4:1 by volume), followed by rinsing with ethanol to give a relief pattern having a minimum line width of 6 μm. The sensitivity was 7 mJ/cm$^2$. The pattern was not blurred even when heated at 400° C. for 60 minutes.

EXAMPLE 2

An amine solution was prepared by dissolving 90 g (0.45 mole) of 4,4'-diaminodiphenyl ether and 1.14 g (0.05 mole) of 4,4'-diaminodiphenyl ether-3-carbonamide in 1764 g of N-methyl-2-pyrrolidone in a nitrogen stream. While maintaining the amine solution at about 15° C. with ice cooling, 54.5 g (0.25 mole) of pyromellitic acid dianhydride and 80.5 g (0.25 mole) of 3,3',4,4'-benzophenonetetracarboxylic acid dianhydride were added thereto with stirring. After completion of the addition, the reaction was continued at about 15° C. for additional 3 hours to give a solution (B) of poly(amic acid) having a repeating unit of the formula:

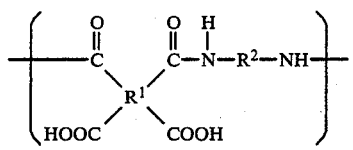

wherein $R^1$ is

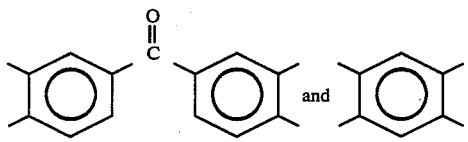

(1:1, molar ratio); and $R^2$ is

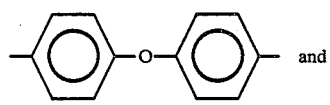

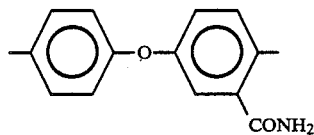

(9:1, molar ratio), and having a viscosity of 55 poises (30° C.).

In 20 g of the solution (B), 1.71 g (0.01 mole) of 3-(N,N-dimethylamino)propyl methacrylate and 0.37 g (0.001 mole) of 2,6-di(4'-azidobenzal)-4-hydroxycyclohexanone were dissolved. The resulting solution was filtered under pressure using a filter having pores of 1 μm.

The resulting solution was spin coated on a silicon wafer using a spinner and dried at 70° C. for 30 minutes to give a coating film of 5.2 μm thick. The coating film was closely covered with a striped photomask made of soda glass and then irradiated with ultraviolet light from a 500 W high pressure mercury lamp. After exposure to light, the coating film was developed with a mixed solution of N-methyl-2-pyrrolidone and ethanol (4:1 by volume), followed by rinsing with ethanol to give a relief pattern having a minimum line width of 6 μm. The sensitivity was 8 mJ/cm². The pattern was not blurred even when heated at 400° C. for 60 minutes.

EXAMPLE 3

In 20 g of the solution (B) obtained in Example 2, 1.71 g (0.01 mole) of 3-(N,N-diethylamino)propyl methacrylate and 0.39 g (0.001 mole) of 2,6-di(4'-azidobenzal)-4-methoxycyclohexanone were dissolved. The resulting solution was filtered under pressure using a filter having pores of 1 μm.

The resulting solution was spin coated on a silicon wafer using a spinner and dried at 70° C. for 30 minutes to give a coating film of 4.9 μm thick. The coating film was closely covered with a striped photomask made of soda glass and then irradiated with ultraviolet light from a 500 W high pressure mercury lamp. After exposure to light, the coating film was developed with a mixed solution of N-methyl-2-pyrrolidone and ethanol (4:1 by volume), followed by rinsing with ethanol to give a relief pattern having a minimum line width of 6 μm. The sensitivity was 15 mJ/cm². The pattern was not blurred even when heated at 400° C. for 60 minutes.

EXAMPLE 4

A diamine solution was prepared by dissolving 100 g (0.5 mole) of 4,4'-diaminodiphenyl ether in 1,388 g of N-methyl-2-pyrrolidone in a nitrogen stream. Next, 147 g (0.5 mole) of 3,3',4,4'-biphenyltetracarboxylic acid dianhydride was added with stirring while the solution was maintained at a temperature of about 15° C. by ice-cooling. After completion of the addition, the resulting mixture was subjected to reaction at about 15° C. for another 5 hours to obtain a solution (C) of poly(amic acid) having a repeating unit of the formula (C) which had a viscosity of 50 poises (30° C.).

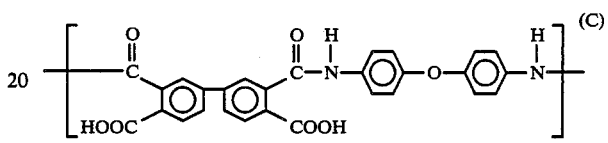

In 20 g of the solution (C) were dissolved 2.08 g (0.0121 mole) of 3-(N,N-dimethylamino)propyl methacrylate and 0.48 g (0.0012 mole) of 2,6-di(4'-azidobenzal)-4-carboxycyclohexanone, and the resulting solution was filtered under pressure by using a filter having pores of 1 μm.

The solution thus obtained was spin coated on a silicon wafer by means of a spinner and then dried at 85° C. for 20 minutes to obtain a coating film of 5 μm in thickness. The coating film was closely covered with a striped photo-mask made of sodaglass, and irradiated with ultraviolet light from a 500 W high pressure mercury lamp. The intensity of ultraviolet light on the exposed surface was 3 mW/cm² at a wavelength of 365 nm. After the exposure to light, the coating film was developed with a mixed solution of 4 volumes of N-methyl-2-pyrrolidone and 1 volume of water and rinsed with ethanol to obtain a line-and-space pattern having a minimum line width of 3 μm. The sensitivity was 7 mJ/cm². The pattern thus obtained was not blurred even when heated at 400° C. for 60 minutes.

EXAMPLE 5

In 20 g of the solution (C) obtained in Example 4 were dissolved 2.08 g (0.0121 mole) of 3-(N,N-dimethylamino)propyl methacrylate and 0.54 g (0.0012 mole) of 2,6-di(4'-azidocinnamylidene)-4-carboxycyclohexanone, and the resulting solution was filtered under pressure by using a filter having pores of 1 μm.

The solution thus obtained was spin coated on a silicon wafer by means of a spinner and then dried at 85° C. for 20 minutes to obtain a coating film of 4.5 μm in thickness. The coating film was closely covered with a striped photo-mask made of soda glass, and irradiated with ultraviolet light from a 500 W high pressure mercury lamp. The intensity of ultraviolet light on the exposed surface was 3 mW/cm² at a wavelength of 365 nm. After the exposure to light, the coating film was developed with a mixed solution of 4 volumes of N-methyl-2-pyrorolidone and 1 volume of water and rinsed with ethanol to obtain a line-and-space pattern having a minimum line width of 3 μm. The sensitivity was 15 mJ/cm². The pattern thus obtained was not blurred even when heated at 400° C. for 60 minutes.

EXAMPLE 6

[Methods for synthesizing poly(amic acid)s having a repeating unit of the formula (A), (B) or (C)]

There was made a comparison among performance characteristics of light-sensitive polymer compositions produced by using various poly(amic acid)s. Poly(amic acid)s having a repeating unit of the formula (A), (B) or (C) hereinafter shown and solutions thereof were prepared in the same manner as in Examples 1, 2 and 4, respectively.

[Method for synthesizing a poly(amic acid) having a repeating unit of the formula (D) in the molecule]

An amine solution was prepared by dissolving 90 g (0.45 mole) of 4,4'-diaminodiphenyl ether and 12.5 g (0.05 mole) of 1,3-bis(3-aminopropyl)-1,1,3,3-tetramethyldisiloxane in 1,346 g of N-methyl-2-pyrrolidone in a nitrogen stream. Next, a mixture of 54.5 g (0.25 mole) of pyromellitic acid dianhydride and 80.5 g (0.25 mole) of benzophenonetetracarboxylic acid dianhydride was gradually added with stirring while the solution was maintained at 15° C. by ice-cooling. After completion of the addition, the resulting mixture was subjected to reaction at 15° C. for additional 5 hours to obtain a solution of a poly(amic acid) having a repeating unit of the formula (D) which had a viscosity of 35 poises (25° C.).

[Method for synthesizing a poly(amic acid) having a repeating unit of the formula (E)]

An amine solution was prepared by dissolving 20 g (0.1 mole) of 4,4'-diaminodiphenyl ether in 503 g of N-methyl-2-pyrrolidone in a nitrogen stream. To the solution was gradually added 43.6 g (0.2 mole) of pyromellitic acid dianhydride while the solution was maintained at about 15° C. by ice-cooling, and reaction was effected for 2 hours. To the solution thus obtained was gradually added 25.2 g (0.1 mole) of 4,4'-diphenylether diisocyanate, and after completion of the addition, 0.1 g of benzyldimethylamine was added. Further, the resulting mixture was heated to 75° C. and subjected to reaction for 3 hours to obtain a solution of a poly(amic acid) having a repeating unit of the formula (E) which had a viscosity of 15 poises (25° C.).

[Method for synthesizing a poly(amic acid) having a repeating unit of the formula (F)]

An amine solution was prepared by dissolving 18 g (0.09 mole) of 4,4'-diaminodiphenyl ether and 2.4 g (0.01 mole) of 4,4'-diaminodiphenylether-3-carbonamide in 564 g of N-methyl-2-pyrrolidone in a nitrogen stream. A mixture of 21.8 g (0.1 mole) of pyromellitic acid dianhydride and 32.2 g (0.1 mole) of benzophenonetetracarboxylic acid dianhydride was gradually added to the solution while the solution was maintained at about 15° C. by ice-cooling, and after completion of the addition, the resulting mixture was subjected to reaction for additional 2 hours. To the solution thus obtained was gradually added 25.2 g (0.1 mole) of 4,4'-diphenylether diisocyanate, and after completion of the addition, 0.1 g of benzyldimethylamine was added. Further, the resulting mixture was heated to 75° C. and subjected to reaction for 3 hours to obtain a solution of a poly(amic acid) having a repeating unit of the formula (F) which had a viscosity of 17 poises (25° C.).

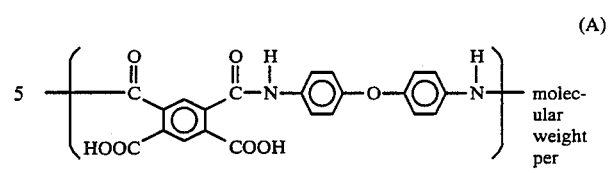

(A) molecular weight per repeating unit: 418

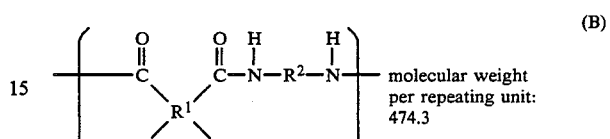

(B) molecular weight per repeating unit: 474.3

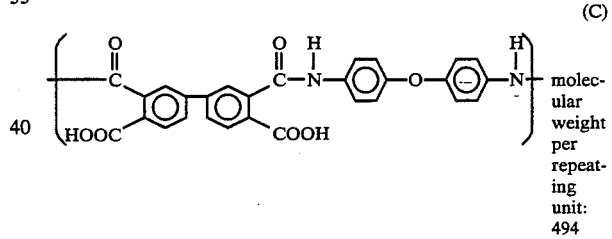

wherein $R^1$ is (1:1, molar ratio,) and $R^2$ is (9:1, molar ratio)

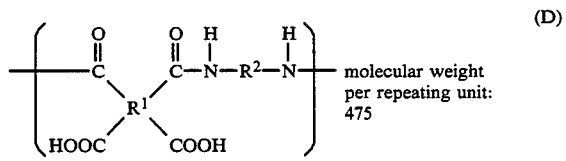

(C) molecular weight per repeating unit: 494

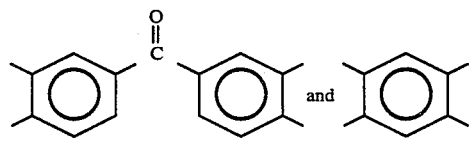

(D) molecular weight per repeating unit: 475 wherein $R^1$ is

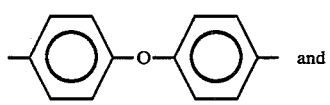

(1:1, molar ratio); and $R^2$ is and

-continued

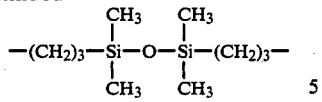

(9:1, molar ratio).

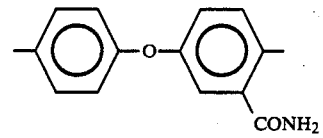

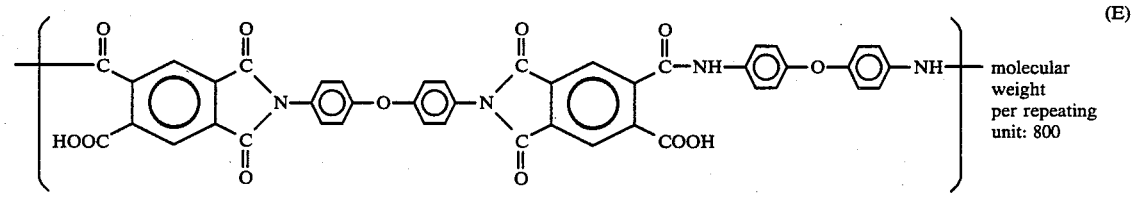

(E) molecular weight per repeating unit: 800

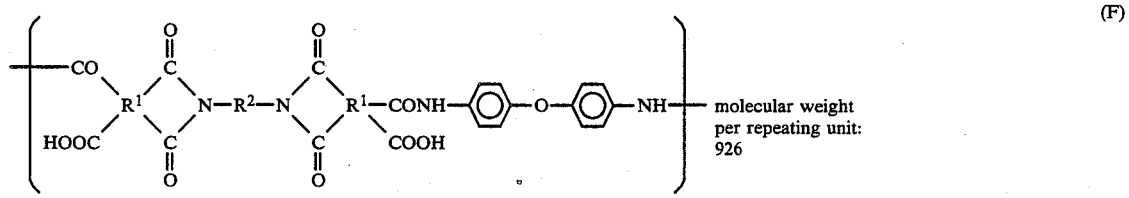

(F) molecular weight per repeating unit: 926 wherein R¹ is

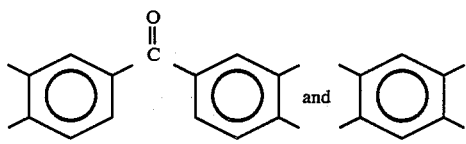

(1:1, molar ratio); and R² is

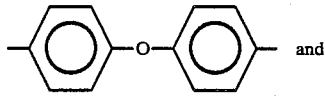

(9:1, molar ratio).

In each of these seven solutions of a poly(amic acid) were dissolved 2,6-di(4'-azidobenzal)-4-carboxycyclohexanone or 2,6-di(4'-azidobenzal)-4-hydroxymethylcyclohexanone and 3-(N,N—dimethylamino)propyl methacrylate $$[CH_2=\underset{CH_3}{\overset{CH_3}{C}}COOCH_2CH_2CH_2N(CH_3)_2]$$

in amounts of 0.2 mole and 2 moles, respectively, per mole of the poly(amic acid) in terms of the repeating unit of the poly(amic acid), and the resulting solution was filtered under pressure by using a filter having pores of 1 μm. Twelve solutions shown in Table 1 were thus obtained.

Each of these solutions was coated on a silicon wafer by means of a spinner and dried at 85° C. for 20 minutes to obtain a coating film of 5 to 6 μm in thickness.

TABLE 1

| No. | Poly(amic acid) | Bisazide (amount dissolved in 100 g of NMP, g) | Amine | Sensitivity (mJ/cm²) |
|---|---|---|---|---|
| 1 | (A) |  (3.06) | $CH_2=\underset{CH_3}{\overset{}{C}}COOCH_2CH_2CH_2N(CH_3)_2$ | 7 |
| 2 | (B) | (2.97) | " | 6 |

TABLE 1-continued
| No. | Poly(amic acid) | Bisazide (amount dissolved in 100 g of NMP, g) | Amine | Sensitivity (mJ/cm²) |
|---|---|---|---|---|
| 3 | (C) | 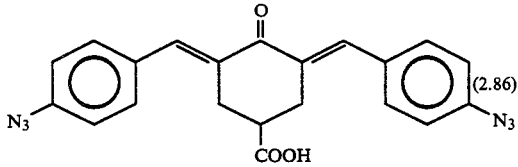 (2.86) | " | 7 |
| 4 | (D) | 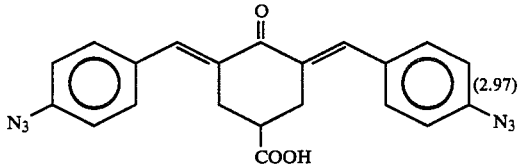 (2.97) | " | 7 |
| 5 | (E) | 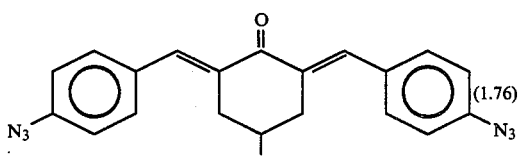 (1.76) | " | 16 |
| 6 | (F) | 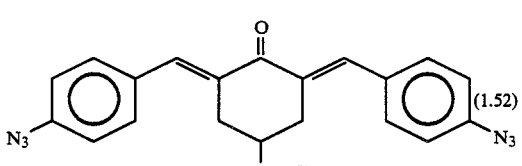 (1.52) | " | 15 |
| 7 | (A) | 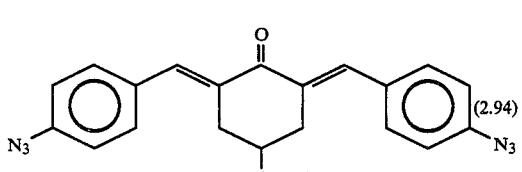 (2.94) | " | 8 |
| 8 | (B) | 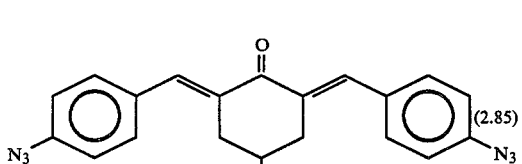 (2.85) | " | 7 |
| 9 | (C) | 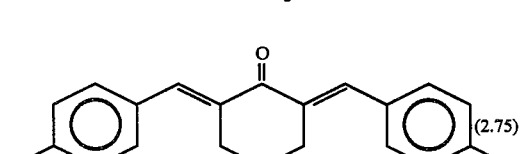 (2.75) | " | 7 |
| 10 | (D) | 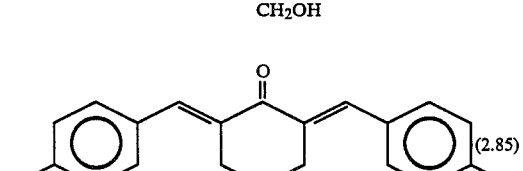 (2.85) | " | 9 |

TABLE 1-continued

| No. | Poly(amic acid) | Composition of light-sensitive polymer composition Bisazide (amount dissolved in 100 g of NMP, g) | Amine | Sensitivity (mJ/cm$^2$) |
|---|---|---|---|---|
| 11 | (E) | 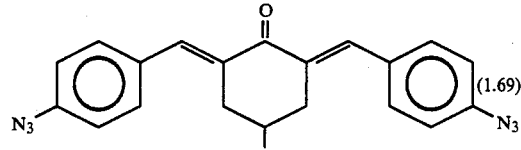 (1.69) | " | 16 |
| 12 | (F) | 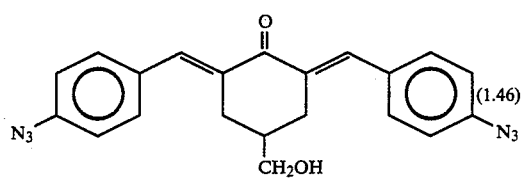 (1.46) | " | 18 |

The coating film was closely covered with striped photo-mask made of soda glass, and irradiated with ultraviolet light from a 500 W high pressure mercury lamp. The intensity of the ultraviolet light was 3 to 4 mW/cm$^2$ at a wavelength of 365 nm on the exposed surface. After the exposure to light, the coating film was developed with a mixed solution of 4 volumes of N-methyl-2-pyrrolidone and 1 volume of water and rinsed with ethanol to obtain a line-and-space pattern having a minimum line width of 3 to 4 μm. The pattern thus obtained was not blurred even when heated at 400° C. for 60 minutes.

As shown in Table 1, the sensitivity was as good as 6 to 18 mJ/cm$^2$ in all the cases though it varies a little depending on the kind of the poly(amic acid). Here, the sensitivity was defined as an exposure dose at which the film thickness after the development was reduced to one-half that before the development when the wavelength for measuring the exposure dose was 365 nm.

EXAMPLE 7

With 10 g of the solution of a poly(amic acid) having a repeating unit of the formula (A) which had been obtained in Example 1 was mixed 10 g of the solution of a poly(amic acid) having a repeating unit of the formula (C) which had obtained in Example 4. In the resulting solution were dissolved 2.23 g (0.013 mole) of 3-(N,N-dimethylamino)propyl methacrylate and 0.52 g (0.0013 mole) of 2,6-di(4'-azidobenzal)-4-carboxycyclohexanone, and the resulting solution was filtered under pressure by using a filter having pores of 1 μm.

The solution thus obtained was spin coated on a silicon wafer by means of a spinner and then dried at 85° C. for 20 minutes to obtain a coating film of 4.7 μm in thickness. The coating film was closely covered with a striped photo-mask made of soda glass, and irradiated with ultraviolet light from a 500 W high pressure mercury lamp. After the exposure to light, the coating film was developed with a mixed solution of 4 volumes of N-methyl-2-pyrrolidone and 1 volume of water and rinsed with ethanol to obtain a line-and-space pattern having a minimum line width of 3 μm. The sensitivity was 7 mJ/cm$^2$. The pattern thus obtained was not blurred even when heated at 400° C. for 60 minutes.

EXAMPLE 8

In 20 g of the solution of a poly(amic acid) having a repeating unit of the formula (A) which had been obtained in Example 1 were dissolved 2.08 g (0.012 mole) of 3-(N,N-dimethylamino)propyl methacrylate, 0.24 g (0.0006 mole) of 2,6-di(4'-azidobenzal)-4-carboxycyclohexanone and 0.27 g (0.0006 mole) of 2,6-di(4'-azidecinnamylidene)-4-carboxycyclohexanone, and the resulting solution was filtered under pressure by using a filter having pores of 1 μm.

By use of the solution thus obtained, a coating film of 5.1 μm in thickness was obtained under the same conditions as shown in Example 6. Further, under the same experimental conditions as in Example 6, the coating film was irradiated with ultraviolet light, developed, and then rinsed to obtain a line-and-space pattern having a minimum line width of 3 μm. The sensitivity was 8 mJ/cm$^2$. The pattern thus obtained was not blurred even when heated at 400° C. for 60 minutes.

EXAMPLE 9

In 20 g of the solution of a poly(amic acid) having a repeating unit of the formula (A) which had been obtained in Example 1 were dissolved 1.04 g (0.006 mole) of 3-(N,N-dimethylamino)propyl methacrylate, 0.95 g (0.006 mole) of 2-(N,N-dimethylamino)ethyl methacrylate and 0.48 g (0.0012 mole) of 2,6-di(4'-azidobenzal)-4-carboxycyclohexanone, and the resulting solution was filtered under pressure by using a filter having pores of 1 μm.

By use of the solution thus obtained, a coating film of 4.7 μm in thickness was obtained under the same conditions as shown in Example 6. Further, under the same experimental conditions as in Example 6, the coating film was irradiated with ultraviolet light, developed, and then rinsed to obtain a line-and-space pattern having a minimum line width of 3 μm. The sensitivity was 7 mJ/cm$^2$. The pattern thus obtained was not blurred even when heated at 400° C. for 60 minutes.

EXAMPLE 10

With 10 g of the solution of a poly(amic acid) having a repeating unit of the formula (A) which had been obtained in Example 1 was mixed 10 g of the solution of a poly(amic acid) having a repeating unit of the formula (C) which had been obtained in Example 4. In the resulting solution were dissolved 1.12 g (0.0065 mole) of 3-(N,N-dimethylamino)propyl methacrylate, 1.03 g (0.0065 mole) of 2-(N,N-dimethylamino)ethyl methacrylate, 0.26 g (0.00065 mole) of 2,6-di(4'-azidobenzal)-4-carboxycyclohexanone and 0.27 g (0.00065 mole) of 2,6-di(4'-azidocinnamylidene)-4-carboxycyclohexanone, and the resulting solution was filtered under pressure by using a filter having pores of 1 μm.

By use of the solution thus obtained, a coating film of 4.5 μm in thickness was obtained under the same conditions as shown in Example 6. Further, under the same experimental conditions in Example 6, the coating film was irradiated with ultraviolet light, developed, and rinsed to obtain a line-and-space pattern having a minimum line width of 3 μm. The sensitivity was 8 mJ/cm². The pattern thus obtained was not blurred even when heated at 400° C. for 60 minutes.

EXAMPLE 11

There were examined the solubilities of seven bisazides, 2,6-di(4'-azidobenzal)-4-hydroxymethylcyclohexanone, 2,6-di(4'-azidobenzal)-4-carboxycyclohexanone, 2,6-di(4'-azidobenzal)-4-methoxycyclohexanone, 2,6-di(4'-azidobenzal)-4-hydroxycyclohexanone, 2,6-di(4'-azidobenzal)-4-methylcyclohexanone, 2,6-di(4'-azidobenzal)-4-ethylcyclohexanone and 2,6-di(4'-azidobenzal)-cyclohexanone in N-methyl-2-pyrrolidone (NMP) and N,N-dimethylacetamide (DMAc) which are aprotic polar solvents.

The measurement results are shown in Table 2. From these results, it is clear that Nos. 1 to 4 having a polar group in the molecule are superior in solubility to Nos. 5 to 7 having no polar group in the molecule, and that among them, Nos. 1, 2 and 4 are particularly good in solubility.

TABLE 2

| No. | Bisazide | Solubility in NMP (g/100 g) | Solubility in DMAc (g/100 g) |
| --- | --- | --- | --- |
| 1 | $N_3$-C$_6$H$_4$-CH=[cyclohexanone with CH$_2$OH at 4-position]=CH-C$_6$H$_4$-$N_3$ | 35 | 36 |
| 2 | $N_3$-C$_6$H$_4$-CH=[cyclohexanone with COOH at 4-position]=CH-C$_6$H$_4$-$N_3$ | 25 | 27 |
| 3 | $N_3$-C$_6$H$_4$-CH=[cyclohexanone with OCH$_3$ at 4-position]=CH-C$_6$H$_4$-$N_3$ | 5.2 | 5.5 |
| 4 | $N_3$-C$_6$H$_4$-CH=[cyclohexanone with OH at 4-position]=CH-C$_6$H$_4$-$N_3$ | 21 | 22 |
| 5 | $N_3$-C$_6$H$_4$-CH=[cyclohexanone with CH$_3$ at 4-position]=CH-C$_6$H$_4$-$N_3$ | 1.0 | 1.1 |
| 6 | $N_3$-C$_6$H$_4$-CH=[cyclohexanone with C$_2$H$_5$ at 4-position]=CH-C$_6$H$_4$-$N_3$ | 0.9 | 0.9 |

TABLE 2-continued

| No. | Bisazide | Solubility in NMP (g/100 g) | Solubility in DMAc (g/100 g) |
|---|---|---|---|
| 7 | 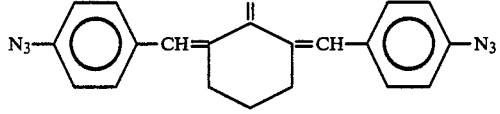 | 1.2 | 1.1 |

EXAMPLE 12

There was made a comparison among the performance characteristics of light-sensitive polymer compositions produced by using various bisazides. The bisazides used were six in all, namely, No.s 1 to 5 in table 2 and 2,6-di(4'-azidocinnamylidene)-4-carboxycyclohexanone, and poly(amic acid)s were two kinds of poly(amic acid)s having a repeating unit of the formula (A) or (C) used in Example 6, and 2-(N,N-dimethylamino)ethyl methacrylate was used as amine.

The test results are shown in Table 3.

TABLE 3

Light-sensitive polymer composition

| No. | Poly(amic acid) | Bisazide (amount dissolved in 100 g of NMP) | Amine | Sensitivity (mJ/cm²) | Storage stability of varnish (5° C.) | Deposition of bisazide from coating film in drying step |
|---|---|---|---|---|---|---|
| 1 | Poly(amic acid) having repeating unit (A) | N₃—C₆H₄—CH=CH—CO—(cyclohexanone with CH₂OH)—CO—CH=CH—C₆H₄—N₃ (3.94) | CH₂=C(CH₃)COOCH₂CH₂CH₂N(CH₃)₂ | 8 | Good | None |
| 2 | Poly(amic acid) having repeating unit (A) | N₃—C₆H₄—CH=CH—CO—(cyclohexanone with COOH)—CO—CH=CH—C₆H₄—N₃ (3.06) | " | 7 | Good | None |
| 3 | Poly(amic acid) having repeating unit (A) | N₃—C₆H₄—CH=CH—CO—(cyclohexanone with OCH₃)—CO—CH=CH—C₆H₄—N₃ (2.94) | " | 9 | Bisazide was crystallized and deposited from varnish by storage for several weeks | None |
| 4 | Poly(amic acid) having repeating unit (A) | N₃—C₆H₄—CH=CH—CO—(cyclohexanone with OH)—CO—CH=CH—C₆H₄—N₃ (2.85) | " | 7 | Good | None |
| 5 | Poly(amic acid) having repeating unit (A) | N₃—C₆H₄—CH=CH—CO—(cyclohexanone with CH₃)—CO—CH=CH—C₆H₄—N₃ (2.83)* | " | 95 | Bisazide was crystallized and deposited from varnish during storage | Marked deposition |
| 6 | Poly(amic acid) having repeating unit (A) | N₃—C₆H₄—CH=CH—CH=CH—CO—(cyclohexanone with COOH)—CO—CH=CH—CH=CH—C₆H₄—N₃ (3.46) | " | 14 | Good | None |
| 7 | Poly(amic acid) having repeating unit (C) | N₃—C₆H₄—CH=CH—CO—(cyclohexanone with CH₂OH)—CO—CH=CH—C₆H₄—N₃ (2.75) | " | 7 | Good | None |

TABLE 3-continued

Light-sensitive polymer composition

| No. | Poly(amic acid) | Bisazide (amount dissolved in 100 g of NMP) | Amine | Sensitivity (mJ/cm$^2$) | Storage stability of varnish (5° C.) | Deposition of bisazide from coating film in drying step |
|---|---|---|---|---|---|---|
| 8 | Poly(amic acid) having repeating unit (C) | $N_3$-C$_6$H$_4$-CH=⟨cyclohexanone with COOH⟩=CH-C$_6$H$_4$-$N_3$ (2.86) | " | 7 | Good | None |
| 9 | Poly(amic acid) having repeating unit (C) | $N_3$-C$_6$H$_4$-CH=⟨cyclohexanone with OCH$_3$⟩=CH-C$_6$H$_4$-$N_3$ (2.75) | " | 10 | Bisazide was crystallized and deposited from varnish by storage for several weeks | None |
| 10 | Poly(amic acid) having repeating unit (C) | $N_3$-C$_6$H$_4$-CH=⟨cyclohexanone with OH⟩=CH-C$_6$H$_4$-$N_3$ (2.66) | " | 6 | Good | None |
| 11 | Poly(amic acid) having repeating unit (C) | $N_3$-C$_6$H$_4$-CH=⟨cyclohexanone with CH$_3$⟩=CH-C$_6$H$_4$-$N_3$ *(2.65) | " | 92 | Bisazide was crystallized and deposited from varnish during storage | Marked deposition |
| 12 | Poly(amic acid) having repeating unit (C) | $N_3$-C$_6$H$_4$-CH=CH-CH=⟨cyclohexanone with COOH⟩=CH-CH=CH-C$_6$H$_4$-$N_3$ (3.23) | " | 12 | Good | None |

Note
*dissolved by heating to 50° to 60° C.

As is clear from Table 3, Nos. 1, 2, 4, 6, 7, 8, 10 and 12 produced by using each bisazide having a high solubility in aprotic polar solvents such as NMP are found to have sensitivity one order of magnitude higher than that of Nos. 5 and 11 produced by using each bisazide having a low solubility in these solvents, and not to deposite the bisazides from the varnishes during the storage of varnishes and at the time of drying the coated films. In the cases of Nos. 3 and 9 wherein the solubilities in the above-mentioned solvents are medium, the sensitivity is one order of magnitude higher than that of Nos. 5 and 11 and the bisazides are not deposited at the time of drying the coated films but the bisazides are deposited from the varnishes during the storage thereof.

On the other hand, in the case of Nos. 5 and 11, the sensitivity is not good, the bisazides are deposited from the varnishes during the storage thereof, and the bisazides are also deposited at the time of drying the coated films.

EXAMPLE 13

There was made a comparison among the performance characteristics of light-sensitive polymer compositions produced by using various amines. The amines used are five amines for Nos. 1 to 5 in table 4, namely, 2-(N,N-dimethylamino)ethyl methacrylate, 3-(N,N-dimethylamino)propyl methacrylate, 3-(N,N-dimethylamino)propyl-1,3-pentadiene carboxylate, 4-(N,N-dimethylamino)butyl methacrylate, 4,6-heptadienyl-dimethylamine, and the poly(amic acid) used was that having a repeating unit of the formula (A) in Example 6.

The test results are shown in Table 4. The sensitivity was as good as 7 to 19 mJ/cm² indifferent to the amines.

What is claimed is:

1. A light-sensitive polymer composition for forming fine patterns consisting essentially of:
   (a) 100 parts by weight of a poly(amic acid),
   (b) 0.1 to 100 parts by weight of at least one bisazide compound selected from the group consisting of

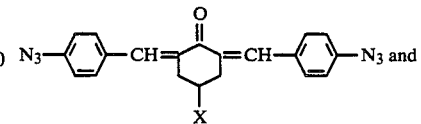

and

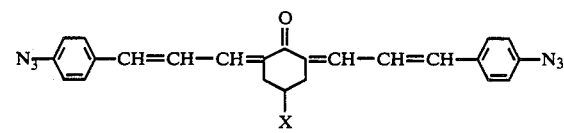

wherein X is —OH, —R³'OH, —OR³ or —COOH; R³ is a lower alkyl group; —R³' is an alkylene group; and
   (c) 1 to 400 parts by weight of a tertiary amine compound together in an admixture.

2. A light-sensitive polymer composition according to claim 1, wherein the bisazide compound (b) is at least one member selected from the group consisting of 2,6-di(4'-azidobenzal)-4-hydroxymethylcyclohexanone, 2,6-di(4'-azidobenzal)-4-carboxycyclodexanone, 2,6-di(4'-azidobenzal)-4-methoxycyclohexanone, 2,6-di(4'-azidobenzal)-4-hydroxycyclohexanone and 2,6-di(4'-azidecinnamylidene)-4-carboxycyclohexanone.

3. A light-sensitive polymer composition according to claim 1, wherein the bisazide compound (b) is at least one compound selected from the group consisting of

TABLE 4

Light-sensitive polymer composition

| No. | Poly(amic acid) | Bisazide (amount dissolved in 100 g of NMP) | Amine | Sensitivity |
|---|---|---|---|---|
| 1 | Poly(amic acid) having repeating unit (A) | N₃—⟨⟩—CH=[cyclohexanone with COOH]=CH—⟨⟩—N₃ (3.06) | CH₂=C(CH₃)COOCH₂CH₂N(CH₃)₂ | 19 |
| 2 | Poly(amic acid) having repeating unit (A) | N₃—⟨⟩—CH=[cyclohexanone with COOH]=CH—⟨⟩—N₃ (3.06) | CH₂=C(CH₃)COOCH₂CH₂CH₂N(CH₃)₂ | 7 |
| 3 | Poly(amic acid) having repeating unit (A) | N₃—⟨⟩—CH=[cyclohexanone with COOH]=CH—⟨⟩—N₃ (3.06) | CH₂=C(CH₃)—COO—(CH₂)₄N(CH₃)₂ | 7 |
| 4 | Poly(amic acid) having repeating unit (A) | N₃—⟨⟩—CH=[cyclohexanone with COOH]=CH—⟨⟩—N₃ (3.06) | CH₃—CH=CH—CH=CH—COO—CH₂CH₂CH₂N(CH₃)₂ | 10 |
| 5 | Poly(amic acid) having repeating unit (A) | N₃—⟨⟩—CH=[cyclohexanone with COOH]=CH—⟨⟩—N₃ (3.06) | CH₂=CH—CH=CH—(CH₂)₃—N(CH₃)₂ | 17 |

2,6-di(4'-azidebenzal)-4-carboxycyclohexanone and 2,6-di(4'-azidecinnamylidene-4-carboxycyclohexanone.

4. A light-sensitive polymer composition according to claim 1, wherein the poly(amic acid) (a) is at least one compound selected from those having in the molecule any of the following repeating unit of the formulae (A) to (F):

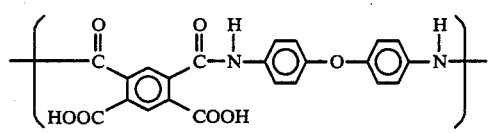 (A)

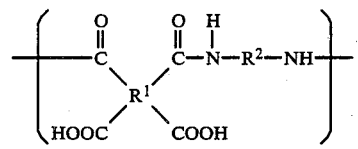 (B)

wherein R¹ is

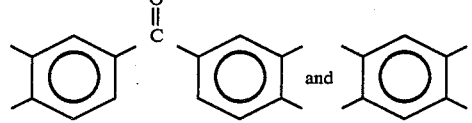

(1:1 in molar ratio), and R² is

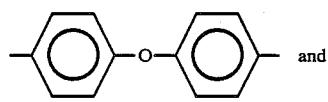 and (9:1 in molar ratio),

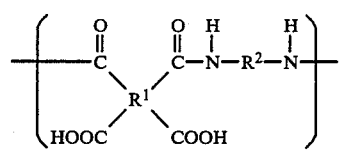 (C)

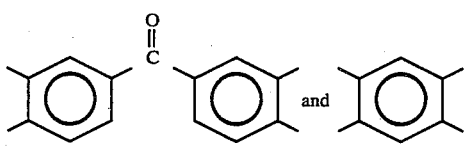 (D)

wherein R¹ is

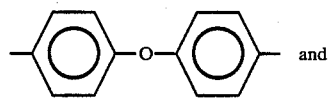 and (1:1 in molar ratio), and R² is

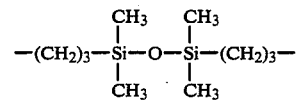 and $$-(CH_2)_3-\underset{\underset{CH_3}{|}}{\overset{\overset{CH_3}{|}}{Si}}-O-\underset{\underset{CH_3}{|}}{\overset{\overset{CH_3}{|}}{Si}}-(CH_2)_3-$$

(9:1 in molar ratio),

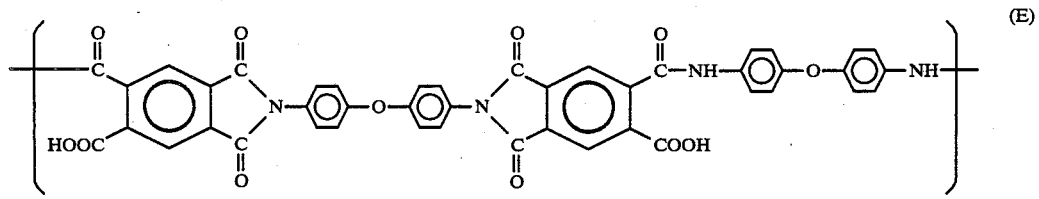 (E)

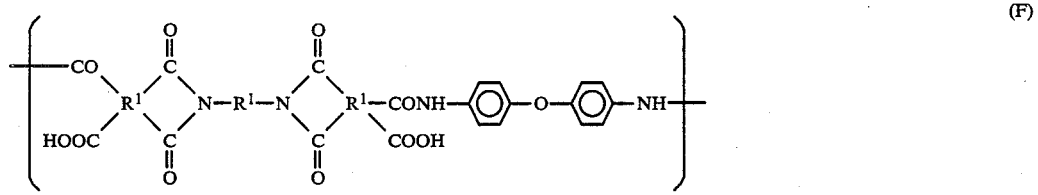 (F)

where R¹ is

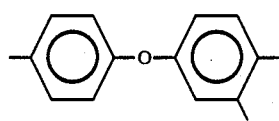

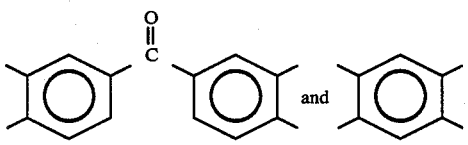 and (1:1 in molar ratio); and R² is

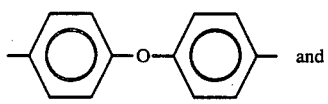 and

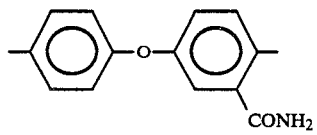

(9:1 in molar ratio).

5. A light-sensitive polymer composition according to claim 4, wherein the tertiary amine compound (c) is at least one compound selected from the group consisting of

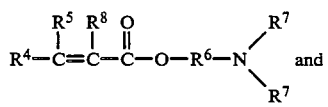 and

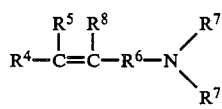

wherein $R^4$ is a vinyl group, a propenyl group, a lower alkyl group or hydrogen; $R^5$ is a lower alkyl group or hydrogen; $R^6$ is an alkylene group; and $R^7$ is a lower alkyl group; and $R^8$ is a lower alkyl group or hydrogen.

6. A light-sensitive polymer composition acoording to claim 1; wherein the tertiary amine compound (c) is at least one compound selected from the group consisting of 2-(N,N-dimethylamino)ethyl methacrylate, 3-(N,N-dimethylamino)propyl methacrylate, 3-(N,N-dimethylamino)propyl-1,3-pentadiene carboxylate, 4-(N,N-dimethylamino)butyl methacrylate and 4,6-heptadienyldimethylamine.

7. A light-sensitive polymer composition according to claim 1, which further consists essentially of an aprotic polar solvent.

8. A light-sensitive polymer composition according to claim 7, wherein the aprotic polar solvent is at least one compound selected from the group consisting of N-methyl-2-pyrrolidone and N,N-dimethylacetamide.

9. A light-sensitive polymer composition for forming fine patterns consisting essentially of:
(a) 100 parts by weight of a poly(amic acid),
(b) 0.1 to 100 parts by weight of at least one bisazide compound selected from the group consisting of

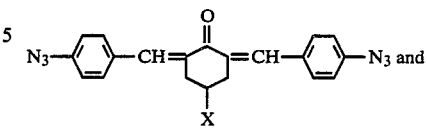 and

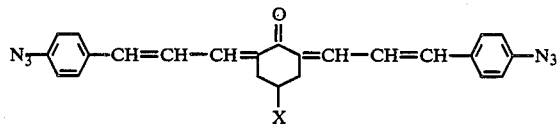

wherein X is —OH, —$R^{3'}$OH, —$OR^3$ or —COOH; $R^3$ is a lower alkyl group; —$R^{3'}$ is an alkylene group;
(c) 1 to 400 parts by weight of a tertiary amine compound; and
(d) 0.1 to 10 parts by weight of a photosensitizer in an admixture; said admixture being dispersed in an aprotic polar solvent.

10. A light-sensitive polymer composition according to claim 9, wherein said aprotic polar solvent is at least one compound selected from the group consisting of N-methyl-2-pyrrolidone and N,N-dimethylacetamide.

11. A light-sensitive polymer composition according to claim 5, wherein the bisazide compound (b) is at least one member selected from the group consisting of of 2,6-di(4'-azidobenzal)-4-hydroxymethylcyclohexanone, 2,6-di(4'-azidobenzal)-4-carboxycyclohexanone, 2,6-di(4'-azidobenzal)-4-methoxycyclohexanone, 2,6-di(4'-azidobenzal)-4-hydroxycyclohexanone and 2,6-di(4'-azidecinnamylidene)-4-carboxycyclohexanone.

* * * * *